March 29, 1955 ARTHUR WU-NIEN LO 2,705,287

PULSE CONTROLLED OSCILLATOR SYSTEMS

Filed March 1, 1954

INVENTOR.
ARTHUR W. LO

BY [signature]

ATTORNEY

United States Patent Office 2,705,287
Patented Mar. 29, 1955

2,705,287

PULSE CONTROLLED OSCILLATOR SYSTEMS

Arthur Wu-Nien Lo, Elizabeth, N. J., assignor to Radio Corporation of America, a corporation of Delaware Application March 1, 1954, Serial No. 413,218

9 Claims. (Cl. 250—36)

This invention relates in general to electrical oscillator systems and in particular to bistable oscillator circuits which operate in a predetermined manner in response to electrical impulses.

An oscillator circuit in which control of the oscillatory state is exercised may be used as a bistable circuit in a short term storage or memory device, since two mutually exclusive stable states exist in such an oscillator circuit.

One type of bistable circuit which has been used in the past for the storage of elements of information is the Eccles-Jordan circuit, in which one or more amplification devices are utilized. Information is stored by virtue of two mutually exclusive stable electrical states which may exist in such a circuit. The output indication for these two stable states consists of two distinct D.-C. levels at the output terminals. In the use of an Eccles-Jordan type of bistable circuit, the large signal or D.-C. characteristics of the amplification device must be used. These D.-C. characteristics will vary considerably for most known amplification devices. This variation sometimes causes unstable or unreliable operation.

It is well known that the small signal characteristics of semiconductor devices show greater uniformity and reliability than the D.-C. characteristics, and it is therefore advantageous to utilize these small signal characteristics when reliability of operation is essential.

Another type of bistable circuit which has been used as a storage element in some automatic computers depends for its operation on the aforementioned small signal characteristics of the amplification device. In this circuit, the amplification device is utilized as a pulse amplifier for alternating signals only. At the output terminals no significant D.-C. level is present and the D.-C. characteristics of the amplification device are relatively unimportant to the circuit operation.

For use as a storage element input information to be stored is applied to the input terminals of the pulse amplifier; the output of this pulse amplifier is passed through a delay line and is re-applied to the input terminals. Hence, if information is to be stored, a pulse is re-circulated through the pulse amplifier, thereby producing a train of pulses at the output terminals. If it is desired to erase this information from the storage element, an inhibit pulse may be aplied at any appropriate point in the input circuit. Thus, control means are available for establishing two distinguishable states: (1) the condition of no signal output and (2) an output consisting of a train of pulses.

This combination of amplification device and a delay line is in effect an oscillating circuit and may be replaced by other conventional oscillators provided that these other oscillators are easily controllable. Hence, an oscillator which can be effected to provide alternately oscillatory and non-oscillator states may be utilized as an information storage means.

It is, therefore, a primary object of this invention to provide an improved oscillator circuit in which the oscillating state is controlled by the application of appropriate electrical impulses and permits the effective utilization of semiconductor devices therein.

It is a further object of this invention to provide a semiconductor circuit having two stable electrical states wherein one of these states gives no indication at the output terminals while the other of these states gives an alternating output signal indication.

It is a still further object of this invention to provide a dynamic storage element for automatic computers in which an alternating output signal indicates the presence of stored information.

An oscillator whose oscillatory and non-oscillatory states may be controlled by means of electrical signals may be utilized to perform many functions other than information storage. Oscillators of this type are sometimes termed gated oscillators.

Gated oscillators, as described in "Waveforms" of the M. I. T. Radiation Laboratories Series, No. 19, pages 140 to 148, by McGraw-Hill, New York, 1949, have been used for the purpose of measuring intervals of time. One method of accomplishing this is to key an oscillator on at the beginning of the time interval to be measured and to pass the output signal from the oscillator to a counting device. At the end of the time interval, the oscillator is keyed off. However, a simplified oscillator circuit for producing the required oscillations with semiconductor devices in such a system, and additionally being easily keyed on and off, would find many useful applications.

It is therefore a further object of this invention to provide a keyed semiconductor oscillator for use in a time interval measuring system in which the measurement is begun and ended with appropriate electrical impulses.

The present invention utilizes a semiconductor device or transistor having the property of current multiplication between its emitter and collector electrodes in combination with associated circuits including an impedance element connected serially with the base electrode to provide regenerative feedback, whereby oscillations are produced. The oscillator thus formed is controlled by the application of pulses of suitable polarity to the base or emitter electrode of the aforementioned transistor.

The frequency of the oscillations is determined by a tank circuit consisting of the combination of a capacitor and an inductor connected in series in the order named between the emitter and base electrodes, such that the circuit is completed through the base-emitter path of the transistor. When the current flows through this tank circuit in a direction such that the rectifying contact formed by the emitter and base electrodes of the transistor is biased in the forward direction or direction of easy current flow, current amplification takes place. Because of the negative resistance associated with the transistor input impedance due to this current amplification, power is supplied to the tank circuit during this half cycle. During the other half cycle, the base and emitter electrodes are biased in a reverse direction so that the base-emitter path of the transistor offers a high impedance to the associated circuit. In order to allow current to flow through the tank circuit, a diode is placed between the base and emitter electrodes and poled in such a direction as to provide an easy path for current during this half cycle.

The capacitor constitutes an open circuit for direct current in the emitter circuit. Since a small but definite forward current must flow through the emitter electrode in order to start oscillations, the circuit remains in its quiescent state even in the presence of normal circuit noise. If, however, an input pulse of proper polarity, such as a pulse of negative polarity when applied to a transistor having a semiconductive body of *n* type germanium, is applied to the base electrode, the circuit will be brought into its oscillating state. On the other hand, a pulse of opposite polarity will cause the oscillations to stop.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
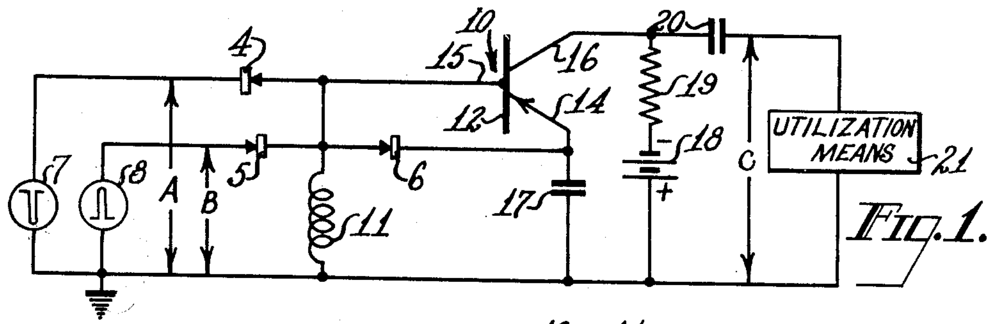
Figure 1 is a schematic circuit diagram of an oscillator circuit embodying the invention.

Referring now to the drawing, wherein like elements are designated by like reference numerals throughout the various figures, and referring particularly to Figure 1, a transistor 10 includes a semiconductive body 12 shown for purposes of illustration to be of *n* type, having an emitter electrode 14, a base electrode 15, and a collector electrode 16 cooperatively associated therewith. A capacitor 17 and an inductor 11 are serially connected between the emitter electrode 14 and the base electrode 15, thus forming a tank circuit including the base to emitter path through the transistor. A source of energizing potential represented by a battery 18 has its negative terminal connected through a resistor 19 to the collector electrode 16. The positive terminal of the battery 18 is connected to the junction of the inductor 11 and the capacitor 19.

The transistor 10 may be a point contact transistor or more broadly a transistor having current multiplication between its emitter and collector electrodes. This transistor 10 utilizes *n* type material for the semiconductive body 12. It is to be noted that a transistor having *p* type material for its semiconductive body may also be utilized, provided the polarity of the source of potential is reversed, and provided also that the polarities of any applied pulses are also reversed.

A capacitor 20 couples the collector electrode to the utilization means 21. Negative pulse signals for initiating oscillations are derived from a generator 7 and applied to the isolating diode 4 and a point of substantially fixed reference potential 3 to which the junction of the inductor 11 and the capacitor 17 is also connected. The inductor 11 provides regeneration due to the current multiplying properties of the transistor, and is adjusted to be of proper magnitude for oscillations to start upon the application of a negative pulse from the generator 7. During the first half cycle, current flowing from the emitter electrode 14 to the base electrode 15 will cause the series impedance in the base-emitter path to be low. During the next half cycle, however, the impedance between the base electrode 15 and the emitter electrode 14 will be high because of reverse bias on these electrodes. In order to overcome this difficulty, a diode 6 is connected between the base electrode 15 and the emitter electrode 14, and is poled in such a direction as to offer a low impedance path during this half cycle.

During the portion of the cycle in which emitter current flows, amplification takes place, and a pulse of current flows to the resonant circuit. During the rest of the cycle, current flows around the loop formed by the inductor 11, the diode 6, and the capacitor 17.

In order to stop the oscillations, a positive pulse from a generator 8 is applied to the base electrode 15 through the isolating diode 5. This positive pulse momentarily biases the base-emitter path of the transistor in the reverse direction so that amplification does not take place. The oscillations are thereby terminated by the appearance of a high impedance path in series with the resonant circuit composed of the inductor 11 and capacitor 17.

Figure 2:
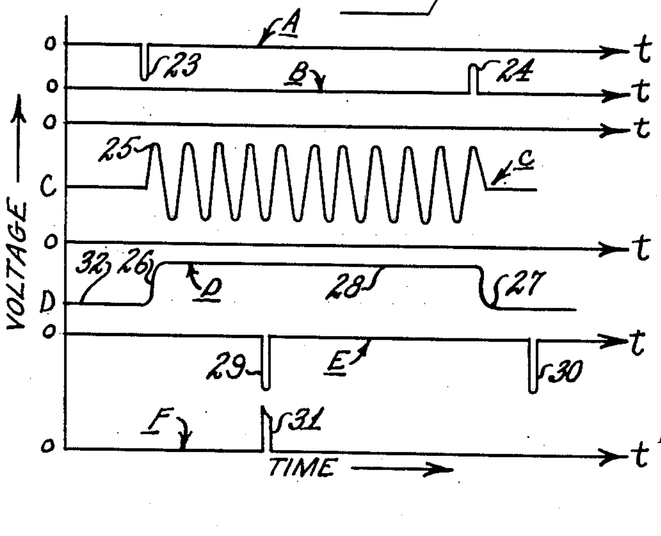
Figure 2 is a graph showing voltage amplitude curves characteristic of circuits embodying the invention.

Referring now to Figure 2, a negative pulse 23 shown in the curve A and applied to the isolating diode 4 of the circuit of Figure 1 will initiate oscillations thereby producing an output signal, shown in the curve C in Figure 2 as an output waveform 25. A positive pulse 24 shown in the curve B when applied to the isolating diode 5 of Figure 1 will serve to stop the oscillations. It is noted that all the curves of Figure 2 have a common time base. The additional curves D, E and F are pertinent to a circuit which will be discussed subsequently.

Figure 3:
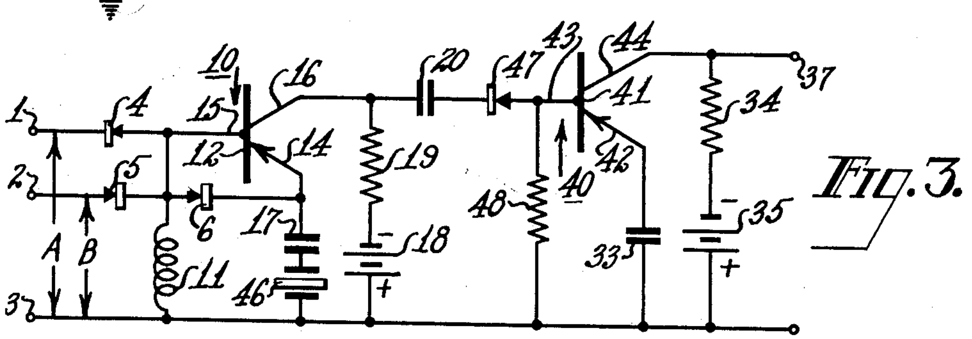
Figure 3 is a schematic circuit diagram of a portion of a time interval measuring apparatus embodying the oscillator circuit of Figure 1 in modified form in accordance with the invention.

In a time interval measuring apparatus, shown in Figure 3, a transistor 10 having a semiconductive body 12, an emitter electrode 14, a base electrode 15, and a collector electrode 16 is connected in a circuit similar to that described with reference to Figure 1.

The impedance element represented by the inductor 11 is connected between the base electrode 15 and ground. The capacitor 17 and an additional frequency determining element represented in Figure 3 by a piezoelectric crystal 30 are connected serially between the emitter electrode 14 and ground. The diode 6 is connected between the base electrode 15 and the emitter electrode 14 in order to provide a conductive path in series with the resonant circuit when the rectifying contact between base and emitter electrodes of the transistor is biased in the reverse direction, as discussed in connection with the circuit of Figure 1.

Currents for the transistor are supplied by the battery 18 and the D.-C. conductive impedance element 19, connected serially between the collector electrode 16 and ground 3.

The piezoelectric crystal 30 of this circuit provides for an output signal of substantially constant and predetermined frequency which may be used to accurately measure time intervals. At the beginning of the time interval to be measured, a negative initiating pulse from any convenient source, applied between an input terminal 1 and the ground 3, reaches the base electrode 15 by means of the diode 4. This pulse initiates oscillations in the circuit by biasing the transistor into the active region of gain, thereby producing a periodic output signal of accurately predetermined frequency. At the end of the time interval to be measured, a positive terminating pulse is applied between an input terminal 2 and ground. This pulse causes the rectifying contact between the base and emitter electrodes to be biased in the reverse direction, thereby causing the oscillations to cease.

In this manner a periodic waveform of accurately predetermined frequency is generated for a length of time determined by the spacing of the initiating and terminating pulses applied by the source at the input terminals 1 and 2 respectively. The number of cycles in this waveform will be a measure of the desired time interval. This number may be counted electronically by any of several well-known counting means which may be connected to the output terminal 37.

In order to present to the counting means an output signal having a waveform more suitable for the purpose than the approximately sinusoidal waveform from the oscillator circuit, the sinusoidal oscillator output signal is coupled to a monostable trigger circuit through a capacitor 20 and a diode 47. This monostable circuit comprises a transistor 40 of the current multiplication type having a semiconductive body 41, and an emitter electrode 42, a base electrode 43, and a collector electrode 44 cooperatively associated therewith. An impedance element 32 is connected between the base electrode 43 and ground 3, providing regeneration due to the current multiplication property of the transistor 40. A capacitor 33 is connected between the emitter electrode 42 and ground 3. Energizing current flows to the collector electrode 44 by means of a source of energizing potential represented as a battery 35 and a load impedance element 34 connected between the collector electrode 44 and ground 3. Output signals are available at an output terminal 37. These output signals may be connected to a counting device in order to complete the time interval measurement system.

Figure 4:
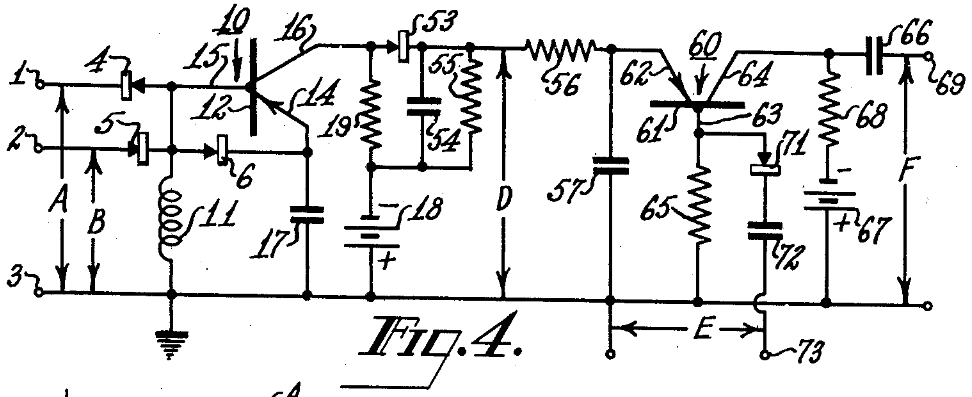
Figure 4 is a schematic circuit diagram of a computer storage or memory circuit provided with oscillator means embodying the invention.

Referring now to Figure 4, associated circuits are shown in combination with the oscillator circuit heretofore described in connection with Figure 1, these circuits being arranged to sense whether the dynamic bistable circuit of the invention is in the oscillating or in the quiescent state.

A transistor 10 is connected in a circuit of the same form as that shown in Figure 1, except that the coupling capacitor 20 of Figure 1 is replaced in the circuit of Figure 4 by a rectifier-filter network comprising a unidirectionally conducting device illustrated as a diode 53 and a capacitor 54. A resistor 55 connected across the capacitor 54 allows charge accumulated on capacitor 54 to leak off. The output of this rectifier-filter combination is integrated by a network including a resistor 56 and a capacitor 57.

A transistor of the current multiplication type 60, having a semiconductive body 61, has an emitter electrode 62 coupled to the output of the integrating network. A resistor 65 connected serially with a base electrode 63 provides regenerative feedback which normally keeps the transistor 60 from operating in the active region of the transistor characteristics. A series combination of a diode 71 and a capacitor 72 is connected between the base electrode 63 and an input terminal 73. The diode 71 is so poled that a negative interrogation pulse applied at the terminal 73 will tend to cause the transistor 60 to conduct. A source of energizing potential represented as a battery 67 in series with a load resistor 68 supplies current to a collector electrode 64. Output signals are delivered to an output terminal 69.

If the transistor 10 is in the quiescent non-oscillating state, the voltage at the output of the rectifier-filter combination, consisting of the diode 53 and the capacitor 54, will be little different from the voltage of the battery 18. This voltage is represented graphically in the curve labeled D of Figure 2 at the point 32. When the transistor 10 is pulsed into its operating state by means of a negative pulse applied at terminal 1, an A.-C. output voltage is developed at the collector electrode 16. This voltage is rectified and filtered by the diode 53 and the capacitor 54 and is applied as bias to the emitter electrode 62 through the integrating network comprising resistor 56 and capacitor 57.

Referring now to Figure 2, the voltage at the output of the rectifier-filter combination, shown graphically by the curve labeled D, thereby rises to the level shown at point 28. This voltage is such that during the period in which it is applied to the emitter electrode 62, an output pulse will be developed at the output terminal 69 by the transistor 60 when a negative interrogation pulse is applied at the terminal 73. If this voltage is at the level of point 32 in curve D, a pulse applied at the terminal 73 will have no effect on the conduction of the transistor 60. Hence, an output signal will appear at the output terminal 69 upon the application of a negative pulse to the terminal 73, if and only if the transistor 10 is in its oscillating state. The output signal under these two conditions of input is shown graphically in the curve labeled F in Figure 2. The curve labeled F shows the output which is obtained when input signal pulses such as those shown in the curve labeled E are applied to terminal 73. If an output signal appears at the output terminal 69 upon the application of an interrogation pulse at terminal 73, then the transistor 10 must be in its oscillating state. If no output signal appears at the output terminal 69 upon the application of the negative interrogation pulse E to terminal 73, then the transistor 10 must be in its quiescent state. This circuit may thereby be used as a storage element for binary information.

From the foregoing consideration of various embodiments of the present invention, it will be seen that effective use may be made of a transistor of the current multiplication type whose signal output is controlled by pulsed input signal means, and that this circuit may be utilized in various applications requiring a pulse-controlled oscillator, such as in time interval measuring apparatus or a computer element for information storage.

What is claimed is:

1. A controllable oscillator circuit comprising in combination, a current multiplication transistor having base, emitter and collector electrodes and providing a base-emitter path between said base and emitter electrodes which is unidirectionally conducting, a resonant tank circuit including inductive and capacitive tuning elements, a unidirectionally conducting device connected in parallel with and poled oppositely to said base-emitter path, said base-emitter path being connected in series between said tuning elements, said unidirectionally conducting device providing substantially the sole external direct current path for currents flowing in the emitter electrode, means for biasing the collector and base electrodes in the reverse direction, input means coupled to said base electrode for applying pulses of alternately opposite polarities to render said oscillator circuit alternately operative and inoperative, and signal output means coupled with said collector electrode.

2. A controllable oscillator circuit comprising in combination a current multiplication transistor including base, emitter and collector electrodes and providing between said base and emitter electrodes a rectifying current path, a capacitive and an inductive impedance element serially connected between said emitter and base electrodes in the order named to provide a series resonant circuit, a unidirectionally conducting device connected in parallel combination with and poled oppositely to said base-emitter path, said parallel combination being connected in series with said series resonant circuit, a source of energizing currents connected between said collector electrode and the junction of said capacitive and inductive impedance elements for biasing said collector and base electrodes in a reverse direction, input means coupled to said base electrode to provide pulses of alternately opposite polarities to render said oscillating circuit alternately operative and inoperative, and signal output means coupled with said collector electrode.

3. A controllable oscillator circuit comprising in combination a current multiplication transistor having base, emitter and collector electrodes, bias means connected between said collector electrode and a point of substantially fixed reference potential, a first impedance element coupled between said emitter electrode and said point of substantially fixed reference potential, a second impedance element connected between said base electrode and said point of substantially fixed reference potential, a unidirectionally conducting device connected between said base and emitter electrodes providing substantially the sole external direct current path for currents flowing in said emitter electrode, input means coupled to said base electrode for applying pulses of alternately opposite polarities to render said oscillating circuit alternately operative and inoperative, and signal output means coupled with said collector electrode.

4. A controllable oscillator circuit as defined in claim 3 wherein said first impedance element is a capacitor and said second impedance element is an inductor, providing in combination a series resonant circuit.

5. A controllable oscillator circuit as defined in claim 4 wherein said input means comprises a first input terminal and a second input terminal, a first diode connected between said first terminal and said base electrode and poled in one direction, and a second diode connected between said second input terminal and said base electrode and poled oppositely to said first diode, whereby said input pulses of alternately opposite polarity are applied alternately to said first and said second input terminals.

6. A controllable oscillator circuit as defined in claim 5 wherein said bias means includes a source of energizing potential connected in series with an impedance element.

7. A controllable oscillator circuit comprising in combination a current multiplication transistor including emitter, base and collector electrodes, a series resonant tank circuit including a capacitive and an inductive impedance element coupled between said base and emitter electrodes, said series resonant tank circuit being completed through the base-emitter path of the transistor whereby said base-emitter path is traversed by the current of said series circuit and is alternately biased in the forward and reverse directions by the current of said series resonant circuit, a unidirectionally conducting device connected between said base and emitter electrodes providing the sole external direct-current path between said base and emitter electrodes, bias means coupled between said collector and base electrodes, and input means for applying pulses of alternately opposite polarities to render said oscillating circuit operative and inoperative.

8. In a time interval measurement apparatus, the combination comprising a current multiplication transistor having base, emitter and collector electrodes and providing a base-emitter path between said base and emitter electrodes which is unidirectionally conducting, bias means applied between said collector electrode and a point of substantially fixed reference potential, an impedance element connected between said base electrode and said point of substantially fixed reference potential whereby said collector and base electrodes are biased in the reverse direction, a piezoelectric device coupled between said emitter electrode and said point of substantially fixed reference potential, a unidirectionally conducting device connected in parallel with said base-emitter path and poled oppositely thereto, input means coupled to said base electrode for applying pulses of alternately opposite polarities to render said apparatus alternately in an oscillating and a nonoscillating state, and utilization means coupled with said collector electrode.

9. A controllable oscillator circuit comprising in combination a current multiplication transistor having base, emitter and collector electrodes, a capacitive and an inductive impedance element serially connected between said emitter and base electrodes to provide a series resonant circuit wherein the base emitter path of said transistor is traversed by the current of said series resonant circuit, whereby in operation said base-emitter path is alternatively biased in the forward and reverse directions, a unidirectionally conducting device connected between said base and emitter electrodes and poled to provide a low impedance direct current path for said current when said base-emitter path is biased in the said reverse direction, energizing means coupled between said collector electrode and the junction of said capacitive and said inductive impedance elements, input means coupled with said base electrode for applying pulses of alternately opposite polarities thereto to render said oscillator circuit alternately operative and inoperative, and utilization means coupled with said collector electrode.

No references cited.